United States Patent
Das et al.

(10) Patent No.: US 9,691,505 B2
(45) Date of Patent: Jun. 27, 2017

(54) DYNAMIC APPLICATION OF ERROR CORRECTION CODE (ECC) BASED ON ERROR TYPE

(71) Applicant: Intel Corporation, Santa Clara, CA (US)

(72) Inventors: Debaleena Das, Los Gatos, CA (US); Rajat Agarwal, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 90 days.

(21) Appl. No.: 14/670,412

(22) Filed: Mar. 27, 2015

(65) Prior Publication Data

US 2016/0284424 A1 Sep. 29, 2016

(51) Int. Cl.
| | |
|---|---|
| G11C 29/42 | (2006.01) |
| G06F 3/06 | (2006.01) |
| G11C 29/44 | (2006.01) |
| G11C 29/52 | (2006.01) |
| G06F 11/10 | (2006.01) |
| G11C 29/04 | (2006.01) |

(52) U.S. Cl.
CPC ............ *G11C 29/42* (2013.01); *G06F 3/064* (2013.01); *G06F 3/0619* (2013.01); *G06F 3/0679* (2013.01); *G06F 11/1048* (2013.01); *G11C 29/44* (2013.01); *G11C 29/52* (2013.01); *G11C 2029/0411* (2013.01)

(58) Field of Classification Search
CPC .... G06F 11/1008; G06F 3/064; G06F 3/0619; G06F 3/0679; G06F 11/1048; G11C 29/42; G11C 29/44; G11C 29/52; G11C 2029/0411
See application file for complete search history.

(56) References Cited

U.S. PATENT DOCUMENTS

| | | | |
|---|---|---|---|
| 2004/0003337 A1* | 1/2004 | Cypher | G11C 29/42 714/763 |
| 2005/0283566 A1* | 12/2005 | Callaghan | G06F 12/1408 711/104 |
| 2007/0234112 A1 | 10/2007 | Thayer et al. | |

(Continued)

FOREIGN PATENT DOCUMENTS

WO 2011160923 A1 12/2011

OTHER PUBLICATIONS

S. Evain and V. Gherman, "Error-correction schemes with erasure information for fast memories," 2013 18th IEEE European Test Symposium (ETS), Avignon, 2013, pp. 1-6.*

(Continued)

*Primary Examiner* — Cynthia Britt
(74) *Attorney, Agent, or Firm* — Compass IP Law PC (57) ABSTRACT

Error correction in a memory subsystem includes determining whether an error is a transient error or a persistent error, and adjusting an approach to ECC (error checking and correction) based on error type. The type of error can be determined by a built in self-test. If the error is a persistent error, the memory controller can perform in erasure mode, including correcting an erasure for an identified error location prior to applying an ECC correction algorithm. Otherwise, if the error is transient, the memory controller can perform standard full ECC correction by applying the ECC correction algorithm.

20 Claims, 5 Drawing Sheets

(56) References Cited

U.S. PATENT DOCUMENTS

| | | |
|---|---|---|
| 2008/0002590 A1 | 1/2008 | Thomas et al. |
| 2008/0163032 A1 | 7/2008 | Lastras-Montano |
| 2010/0005366 A1 | 1/2010 | Dell et al. |
| 2010/0107010 A1* | 4/2010 | Warnes ................. G11C 29/52 714/36 |
| 2010/0122148 A1* | 5/2010 | Flynn ................... G06F 11/108 714/773 |
| 2011/0066919 A1 | 3/2011 | Blankenship et al. |
| 2011/0154152 A1 | 6/2011 | Brzezinski |
| 2013/0124932 A1* | 5/2013 | Schuh ...................... G06F 9/44 714/718 |
| 2014/0006899 A1 | 1/2014 | Das et al. |
| 2014/0047265 A1 | 2/2014 | Das et al. |
| 2014/0059278 A1* | 2/2014 | Schuh ................ G06F 12/0246 711/103 |
| 2014/0095946 A1* | 4/2014 | Mozak .................. G11C 29/56 714/718 |
| 2014/0195867 A1* | 7/2014 | Gollub .................. G11C 29/00 714/719 |
| 2015/0220410 A1 | 8/2015 | Das et al. |

OTHER PUBLICATIONS

M. Caramia, M. Fabiano, A. Miele, R. Piazza and P. Prinetto, "Automated synthesis of EDACs for FLASH memories with user-selectable correction capability," High Level Design Validation and Test Workshop (HLDVT), 2010 IEEE International, Anaheim, FL, 2010, pp. 113-120.*

International Search Report and Written Opinion for PCT Patent Application No. PCT/US2016/021146, Mailed Jun. 17, 2016, 11 pages.

English Translation of Search Report of R.O.C. Patent Application No. 105103788, Received Feb. 22, 2017, 1 page.

* cited by examiner

DYNAMIC APPLICATION OF ERROR CORRECTION CODE (ECC) BASED ON ERROR TYPE

FIELD

Embodiments of the invention are generally related to error detection in a memory subsystem, and more particularly to dynamically selecting an application of error checking and correction (ECC) based on error type.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright© 2015, Intel Corporation, All Rights Reserved.

BACKGROUND

Memory resources are widely used in current computing platforms, whether for servers, desktop or laptop computers, mobile devices, or consumer and business electronics. The increasing amounts of memory in memory subsystems and the increased densities of the memory devices themselves contribute to an increased number of errors in memories. One technique for addressing the increasing memory errors is to employ ECC (error checking and correction). Traditionally a memory controller performs error detection and correction, although there are emerging on-die ECC technologies as well. ECC has become a basic tool for meeting RAS (reliability, accessibility, and serviceability) expectations in modern memory subsystems.

Common memory architectures include x4, x8, or x16 interfaces, where 'x4' refers to a device with a 4 bit wide interface, 'x8' refers to a device with an 8 bit wide interface, and 'x16' refers to a device with a 16 bits wide interface. Implementations of ECC require extra bits or bandwidth to perform the error detection and correction. The design and number of required ECC bits for implementing ECC is dictated mainly by the memory architecture. For example, many traditional ECC implementations support SDDC (single device data correction) or similar implementations. The number of bits for ECC in a DRAM (dynamic random access memory) DIMM (dual inline memory module) is adequate for x4 SDDC where each DRAM device contributes 4 bytes to a cacheline (e.g., a 4-bit wide interface that provides four bits for each cycle of an 8 cycle burst for a total of 4 bytes or 4B). But the number of bits per cacheline affected by a device failure is larger for x8 devices (8B, or 8-bits per cycle for an 8 cycle burst). Consequently, ECC for x8 memory devices traditionally requires lockstep or a comparable mechanism, and has an associated bandwidth and power penalty. Lockstep refers to a partnership between two regions of memory where ECC information is shared for the partnership to spread error correction across the two regions.

However, in certain systems the additional bandwidth and/or power requirements can be impractical. Certain system implementations may suffer significant performance and/or cost penalties in implementing the logic needed for x8 devices. It will be understood that more ECC bits are required for larger interfaces, and there is an associated performance cost associated with using more ECC bits.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, error correction in a memory subsystem includes determining whether an error is a transient error or a persistent error, and adjusting an approach to ECC (error checking and correction) based on error type. The type of error can be determined by a built in self-test. Identifying the error type can specifically identify an error location, which can allow the use of ECC techniques that utilize location information to reduce the number of bits required to perform ECC. For example, if the error is a persistent error, the memory controller can perform ECC in erasure mode, including correcting an erasure for an identified error location prior to applying an ECC correction algorithm such as SDDC (single device data correction). Otherwise, if the error is transient, the memory controller can perform standard full ECC correction by applying the ECC correction algorithm. By applying dynamic ECC based on error type, the system can perform both standard full ECC correction and erasure correction based on the same ECC bits.

It will be understood that transient errors or soft errors are those caused by cosmic radiation or some other anomaly or environmental condition that randomly affects bits. Such errors are typically limited to a single bit or a column. Such errors may occur during one read and not a subsequent read.

In contrast, persistent errors or hard errors or hard failures are those caused by a device defect. While such persistent errors can be limited to a single bit or column, such failures can also affect all bits in a device (such as a DRAM (dynamic random access memory) device). However, many persistent failures can be addressed by erasure ECC in which the system sets up an erasure in the ECC correction path to address the failure.

Thus, as described herein, an ECC path can include two separate modes: a full correction mode, where standard ECC is implemented to identify a failed device and failed bits within the device; and, an erasure mode, where erasure mode ECC corrects failed bits in a device, given the identity of the device. Traditional ECC paths for DIMM (dual inline memory module) ECC techniques always operate in full correction mode. By identifying the error type, a memory controller can switch the ECC between full correction mode and erasure mode based on the type of error. In one embodiment, the same ECC bits operate in both modes, but the two different modes use different correction logic. It will be understood that a block correcting ECC can correct a block size of 'b' in full correction mode, and can correct a block size of '2b' in erasure mode because the location of the blocks is determined.

The ECC path includes a mechanism to determine error type. In one embodiment, the error type determination is a BIST (built in self-test) operation in the ECC correction path, which allows the identification of error type and error location. By knowing error location, the memory controller can perform targeted correction of different failures (either soft or hard) and achieve single device level correction RAS (reliability, addressability, and serviceability) with half the number of bits traditionally required. Thus, for example, an implementation of SDDC can achieve the same level of RAS with half the ECC bits required for legacy SDDC. In one embodiment, such ECC is implemented in servers with IPM (in package memory) architectures and/or in mobile devices, both of which have constraints on the number of ECC bits available. Additionally, such ECC can be implemented as an alternative x8 DIMM SDDC with lockstep, since the ability to use fewer ECC bits can reduce the need for lockstep.

Reference to memory devices can apply to different memory types. Memory devices generally refer to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (dual data rate version 3, original release by JEDEC (Joint Electronic Device Engineering Council) on Jun. 27, 2007, currently on release 21), DDR4 (DDR version 4, initial specification published in September 2012 by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (currently in discussion by JEDEC), WIO3 (Wide I/O 3, currently in discussion by JEDEC), HBM2 (HBM version 2), currently in discussion by JEDEC), and/or others, and technologies based on derivatives or extensions of such specifications.

Figure 1A:
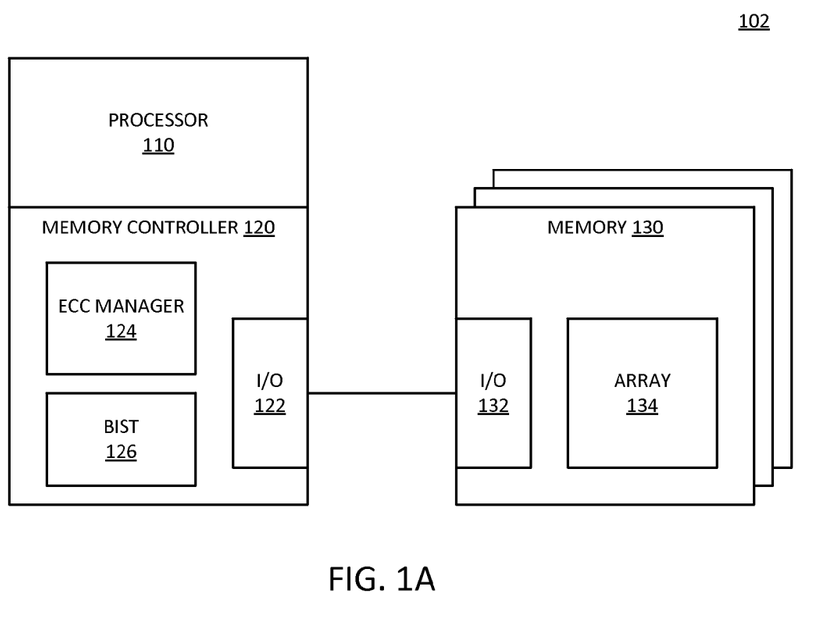
FIG. 1A is a block diagram of an embodiment of a system in which a memory subsystem identifies error type as a factor in the application of ECC.

FIG. 1A is a block diagram of an embodiment of a system in which a memory subsystem identifies error type as a factor in the application of ECC. System 102 represents components of a memory subsystem. System 102 can be included in any type of computing device or electronic circuit that applies ECC at the memory subsystem. Processor 110 represents any type of processing logic or component that executes operations based on data stored in memory 130 or to store in memory 130. Processor 130 can be or include a host processor, central processing unit (CPU), microcontroller or microprocessor, graphics processor, peripheral processor, application specific processor, or other processor. Processor 130 can be or include a single core or multicore circuit.

Memory controller 120 represents logic to interface with memory 130 and manage access to data stored in array 134 of memory 130. In one embodiment, memory 130 includes volatile memory resources. Array 134 represents the rows of memory resources (e.g., cachelines, pages) in which data is stored. In one embodiment, memory controller 120 is integrated into the hardware of processor 110. In one embodiment, memory controller 120 is standalone hardware, separate from processor 110. Memory controller 120 can be a separate circuit on a substrate that includes processor 110. Memory controller 120 can be a separate die or chip integrated on a common substrate with a processor die (e.g., as a system on a chip (SoC)). In one embodiment, at least some of memory 130 can be included on an SoC with processor 110 and/or memory controller 120.

Processor 110 is generally understood within the context of system 102 to generate requests for data from memory 130, and to consume the data returned from memory 130 in response to such requests. In one embodiment, processor 110 and memory controller 120 can together be considered a "host" for which memory 130 stores and returns data. In one embodiment, memory 130 includes only volatile memory resources. In one embodiment, memory 130 includes nonvolatile memory resources. In one embodiment, memory 130 includes DDR4 DRAMs in a DIMM architecture that supports ECC in x8 devices. In one embodiment, memory 130 includes x4 devices.

In one embodiment, system 102 includes multiple memory resources 130. Memory 130 can be implemented in system 102 in any type of architecture that supports access via memory controller 120 with use of ECC. Memory 130 can be managed, for example, as different levels of memory with separate channels, DIMMs (dual inline memory modules), ranks, DRAMs, banks, pages, rows. Each separate memory level and resource can be individually addressable. Memory controller 120 includes I/O (input/output) 122, which includes hardware resources to interconnect with corresponding I/O 132 of memory 130. I/O 122, 132 can include drivers, ODT (on die termination), pins, connectors, traces, pads, wires, and/or other hardware. I/O 122 and 132 are typically organized in one or more buses of signal lines, such as a command/address (C/A) bus for memory controller 120 to send access commands and address information, and a data bus to allow memory controller 120 and memory 130 to exchange data. The data is read from the different memory resources with a Read command or written to the memory resources with a Write command. I/O 122 and I/O 132 can include data interfaces that are x4, x8, or x16 interfaces.

In one embodiment, memory controller includes ECC manager 124 to manage error checking and correction in memory accesses of system 102. In one embodiment, memory 130 can includes internal ECC, which is not shown. ECC manager 124 can spread errors across multiple parallel memory resources. By spreading errors across multiple resources, memory controller 120 can recover data even in the event of one or more failures in memory 130. It will be understood that ECC manager 124 of memory controller 120 can be or include error detection logic and error correction logic. Error detection logic refers to logic that detects errors in read data. Error correction logic refers to logic that corrects error in read data. In one embodiment, ECC manager 124 applies ECC to achieve a single block level correction of RAS. In one embodiment, ECC manager 124 applies ECC to achieve SDDC.

In one embodiment, ECC manager 124 includes or manages two separate ECC paths, with separate correction logic depending on the path used. One path provides standard ECC in full correction mode. Full correction mode ECC does not know the address or device of an error, and therefore corrects errors as though they are random errors. One path provide erasure mode ECC. In one embodiment, memory controller 120 includes BIST (built in self-test) logic 126 to trigger or otherwise cause memory 130 to execute a built in self-test, or executes other logic to determine an error type. In one embodiment, memory controller 120 includes test logic that can be used to detect error type and location in addition to or alternative to BIST 126. BIST 126 enables memory controller to control a BIST test. Memory controller 120 can trigger the determination of the type of error in response to determining that an error exists in data read in response to a read access request.

In one embodiment, BIST 126 performs a simple self-test, such as a loop write to the failing address. In one embodiment, BIST 126 can be a single address loop test. In one embodiment, the self-test can include a simple test pattern, which can be a single pattern test. In one embodiment, the single pattern is an inverse of the bit pattern expected to be read, which is an inverse of the bit pattern that triggered the error detection. In one embodiment, the loop back write test can identify which device is experiencing an error. In one embodiment, one Write command and one Read command (to read out the data written) can successfully implement error type detection. In one embodiment, system 102 includes enough ECC bits to correct the data from half of a device. Thus, one embodiment of BIST 126 can identify which device has an error, allowing the implementation of erasure correction for the detected device. Traditionally, ECC in such an implementation can include a lockstep operation to obtain the desired RAS.

Figure 1B:
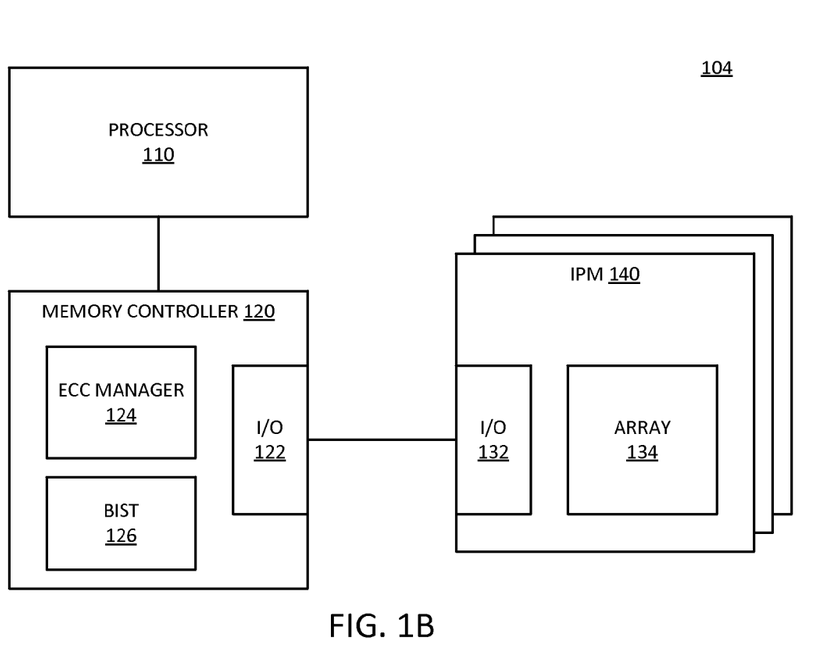
FIG. 1B is a block diagram of an embodiment of a system in which an in-package memory subsystem identifies error type as a factor in the application of ECC.

FIG. 1B is a block diagram of an embodiment of a system in which an in-package memory subsystem identifies error type as a factor in the application of ECC. System 104 can be one example of an embodiment of system 102 of FIG. 1A. System 104 illustrates components labeled with common identifiers of system 102, such as processor 110, memory controller 120, I/O 122, ECC manager 124, I/O 132, BIST 126, and array 134. The descriptions of similarly labeled components in system 102 can apply equally well to these components.

System 104 specifically illustrates the memory device(s) as IPM (in package memory) 140. IPM can also be referred to as on-package memory, and refers to memory resources that are integrated onto a common substrate or package with a single or multicore processor, rather than being integrated into the same die as the processor. In one embodiment, IPM 140 is functionally equivalent to memory 130 of system 102. IPM 140 may include design or architecture changes specific to a memory device integrated on a common SoC package with memory controller 120 and processor 110. In one embodiment, IPM 140 is implemented as a circuit on a common substrate with processor 110. It will be understood that implementation of memory within a SoC package may prevent the use of x4 devices in IPM, while also preventing the application of lockstep. Thus, it will be understood that traditional DIMM SDDC solutions may be impractical or impossible to implement in system 104 with IPM 140. However, when memory controller 120 implements ECC via ECC manager 124 with selective application of ECC based on error type detection, system 104 can apply SDDC to IPM 140. While specifically shown as IPM 140, in one embodiment, system 104 can include memory in an implementation in which lockstep is either impossible or impractical.

Figure 2:
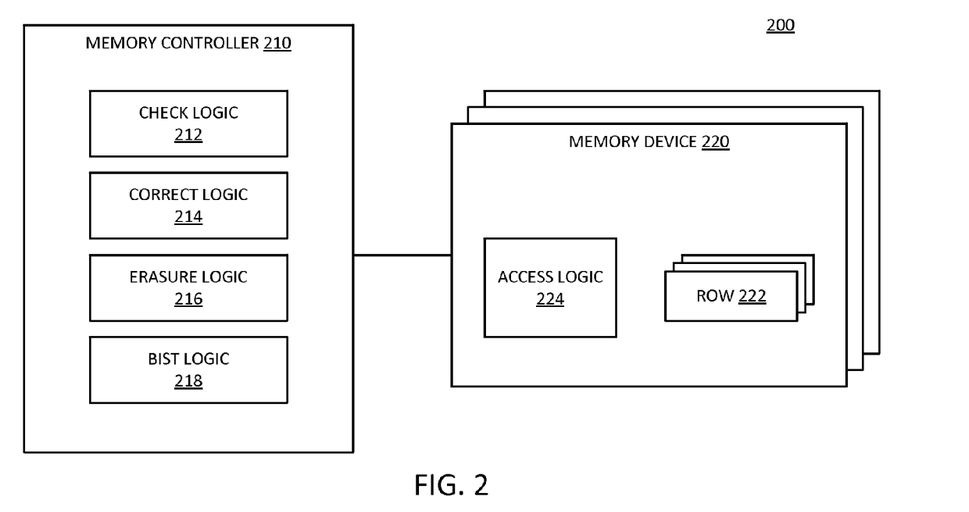
FIG. 2 is a block diagram of an embodiment of ECC logic in a memory subsystem that can dynamically perform ECC based on error type.

FIG. 2 is a block diagram of an embodiment of ECC logic in a memory subsystem that can dynamically perform ECC based on error type. System 200 can be one example of a memory subsystem in accordance with system 102 of FIG. 1A and/or system 104 of FIG. 1B. Memory controller 210 represents a controller or equivalent or alternative circuit or component that manages access to memory device 220. Memory controller 210 performs ECC on data read from memory device 220.

Memory device 220 includes multiple rows of memory resources 222, which represent individually addressable locations within memory device 220. Rows 222 can be individual cachelines or words or pages of cachelines (e.g., one prefetch element that includes multiple cachelines). Memory device 220 includes access logic 224, which represents logic within the memory device to execute access commands to access rows 222. Access logic 224 can also represent logic within memory device 220 to perform a test write to one or more rows 222 in response to a BIST test controlled by BIST logic 218 of memory controller 210. For example, memory device 220 can copy out the memory contents to a spare location, and perform a write and read loopback test on the location prior to copying the memory contents back from the spare location.

In one embodiment, BIST logic 218 performs testing with a single test pattern. In one embodiment, BIST logic 218 applies a pattern that is the inverse of the pattern (e.g., the cacheline data) that resulted in a non-zero syndrome at the error checking. In one embodiment, BIST logic 218 performs a Write cacheline to the cacheline address identified in the error detection. BIST logic 218 can then Read the cacheline data back out. It will be understood that the cacheline addressing can be shared among multiple memory devices 220, which each contribute a certain number of bits of read data to the overall cacheline (e.g., 8 devices each providing 8 bits) read. BIST logic 218 can compare the known written data with the read data to determine specifically which bits failed, and potentially identify a specific device failure.

Testing of an implementation of the BIST logic in ECC has provided the ability to identify and address row failures, column failure, tile/mat failures (e.g., patterns of failures in the memory subsystem, such as a contiguous block of devices failing), and has demonstrated a 100% test success with stuck-at-0/1 failures. In one embodiment, BIST logic 218 identifies the position of "stuck-at" bits. Testing also demonstrates an expectation for high percentage success for weak bits as well (e.g., bits for devices having margining failures). In one embodiment, check logic 212 generates a request for BIST logic 218 to execute in response to detecting an error in read data. In one embodiment, check logic 212 can receive an indication of whether an error occurred in the test, and determine if the detected error in the data is persistent or transient. Thus, in one embodiment, check logic 212 can be said to determine what type of error resulted in a non-zero syndrome, or what type of error was detected in read data. A syndrome refers to a pattern of check bits that indicates error(s) in data tested for an ECC implementation. ECC is commonly applied as a hamming code, in which calculations on a parity-check matrix generate the syndrome to indicate whether there are errors in the received data. The parity-check matrix has coefficients that indicate various levels of parity checks for different overlapping combinations of bits of the data. A non-zero syndrome is a syndrome that indicates at least one error (not all coefficients are zero).

Memory controller 210 includes check logic 212, which represents hardware components to perform ECC checking on read data from memory 220. In one embodiment, check logic 212 tests read data against check bits stored for the data. Check logic 212 can include the application of an XOR (Exclusive OR) tree to a corresponding H matrix to detect errors and selectively correct errors (in the case of a single bit error). As is understood in the art, an H matrix refers to a hamming code parity-check matrix that shows how linear combinations of digits of the codeword equal zero, where the codeword represents an error-free version of the data. Thus, the H matrix rows identify the coefficients of parity check equations that must be satisfied for a component or digit to belong to the codeword. In one embodiment, memory controller 210 includes correct logic 214 to correct errors detected in the read data. In one embodiment, check logic 212 can include a syndrome decoder to apply check bits to the data to detect errors in the read data. In one embodiment, correct logic 214 receives or generates a syndrome to perform error correction for correction of a detected error.

In one embodiment, memory controller 210 includes erasure logic 216 to apply to identified locations of errors for ECC. In one embodiment, erasure logic 216 includes erasures in a correction matrix to allow for the correction of known errors. Such erasure ECC can be used in place of standard ECC correction or as a supplement to standard ECC correction. In one embodiment, memory controller 220 applies correct logic 214 for a full correction mode ECC, and applies erasure logic 216 for an erasure mode ECC. It will be understood that memory controller 210 can include both logics 214 and 216, and apply the appropriate logic based on the error type detected. For example, memory controller 210 can apply correct logic 214 for transient errors or soft errors of random bits. Memory controller 210 can apply erasure logic 216 for hard errors.

Figure 3:
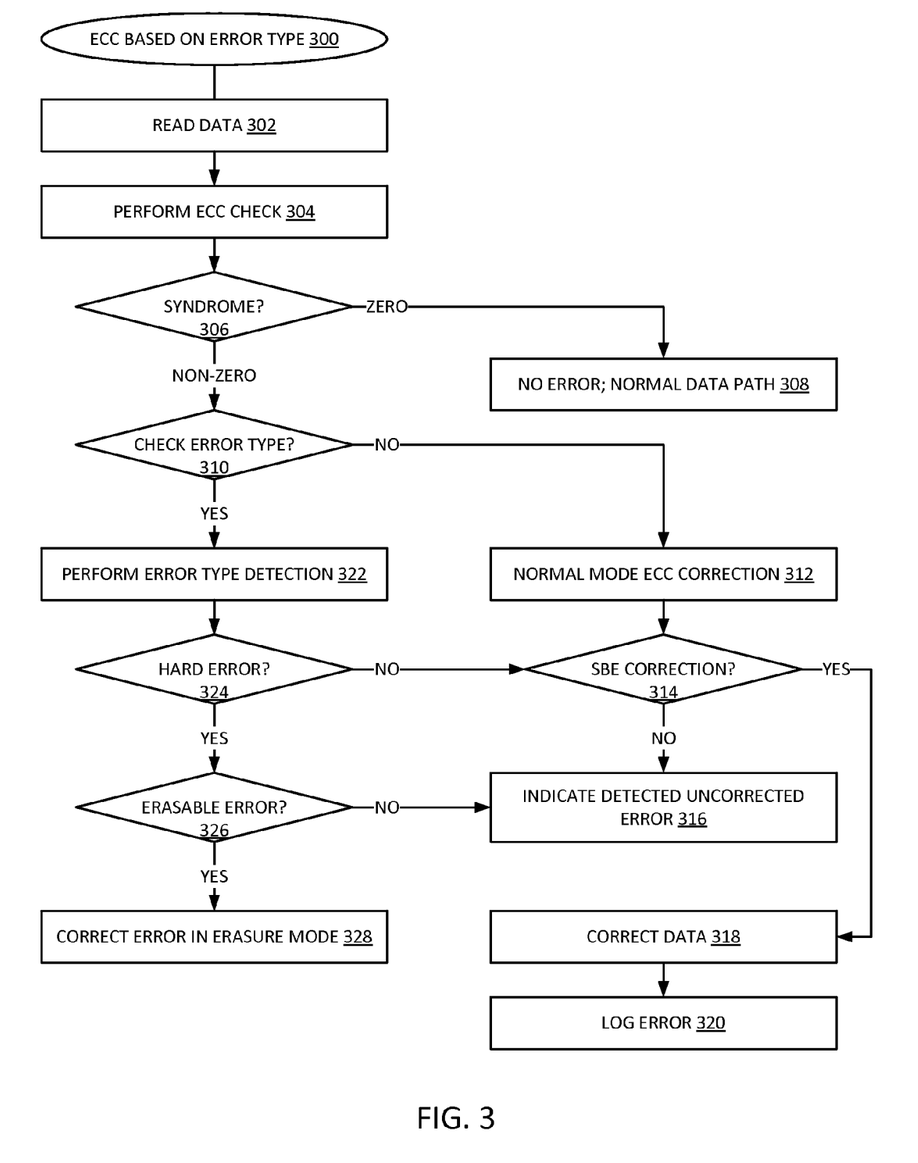
FIG. 3 is a flow diagram of an embodiment of a process for dynamically performing ECC based on error type.

FIG. 3 is a flow diagram of an embodiment of a process for dynamically performing ECC based on error type. Process 300 is a process for performing ECC based on error type in accordance with any embodiment described herein. In general, a memory controller controls the ECC operations. In one embodiment, a memory device performs an error type check, in response to a request by the memory controller.

In one embodiment, a memory controller generates a Read command to associated memory to service a request for data by a host processing component. In one embodiment, the memory controller performs error detection or ECC checking, 304. If the result of the error checking is a zero syndrome, 306 ZERO branch, there is no error in the read data and the memory controller receives the data via a normal read path, 308. If the syndrome is non-zero, 306 NON-ZERO branch, in one embodiment, the memory controller determines whether to check for error type, 310. The syndrome is computed from ECC bits provided by the memory device. In one embodiment, the same ECC bits can be used to apply both normal mode ECC and erasure mode ECC. Thus, the efficiency of the ECC space required can be maximized in that the same ECC bits can be applied to either type of ECC. In one embodiment, the erasure mode and the error type detection are selectively enabled. Thus, if error type detection is not enabled, 310 NO branch, the memory controller can be configured to perform error correction only in normal mode, 312.

In normal ECC correction mode, the memory controller can determine if a detected error is a single bit error (or a single block error, or a single byte error, depending on the granularity of the architecture), 314. If the error is not an SBE, 314 NO branch, in one embodiment, the ECC logic indicates a detected uncorrected error (DUE), 316. If the error is an SBE, 314 YES branch, in one embodiment, the ECC logic correct the data, 318, and logs the error, 320.

If error type detection is enabled, 310 YES branch, the memory controller performs an error type detection, 322. In one embodiment, the error type detection is a BIST test performed by the memory device(s). In one embodiment, the error type detection is based on a testing procedure the memory controller can execute. In one embodiment, if the error detected is not a hard error (as indicated by the error type detection), 324 NO branch, the memory controller performs normal mode ECC correction, 314. In one embodiment, if the error detected is a hard error, 324 YES branch, the memory controller determines if the error is limited to an error size that can be corrected by erasure, 326. Thus, if the error is an erasable error, 326 YES branch, in one embodiment, the memory controller corrects the error in erasure mode, 328. In one embodiment, if the error is not an erasable error, 326 NO branch, the memory controller can indicate a DUE, 316.

Figure 4:
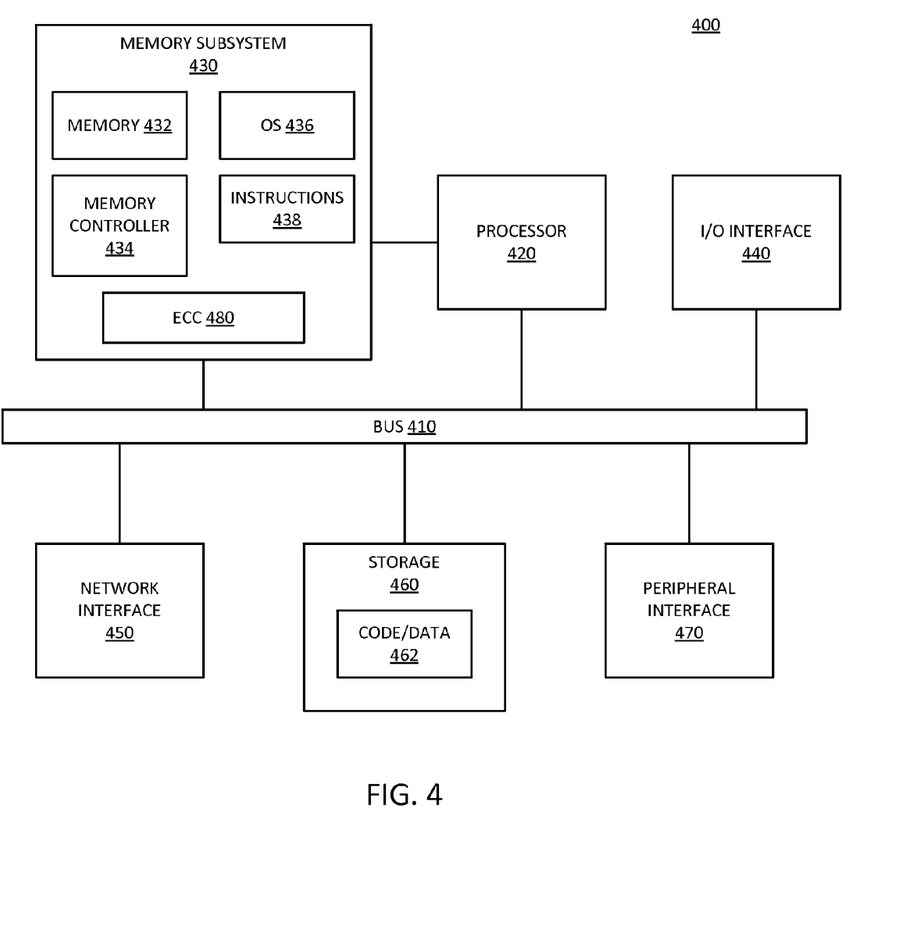
FIG. 4 is a block diagram of an embodiment of a computing system in which dynamic ECC based on error type can be implemented.

FIG. 4 is a block diagram of an embodiment of a computing system in which dynamic ECC based on error type can be implemented. System 400 represents a computing device in accordance with any embodiment described herein, and can be a laptop computer, a desktop computer, a server, a gaming or entertainment control system, a scanner, copier, printer, routing or switching device, or other electronic device. System 400 includes processor 420, which provides processing, operation management, and execution of instructions for system 400. Processor 420 can include any type of microprocessor, central processing unit (CPU), processing core, or other processing hardware to provide processing for system 400. Processor 420 controls the overall operation of system 400, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 430 represents the main memory of system 400, and provides temporary storage for code to be executed by processor 420, or data values to be used in executing a routine. Memory subsystem 430 can include one or more memory devices such as read-only memory (ROM), flash memory, one or more varieties of random access memory (RAM), or other memory devices, or a combination of such devices. Memory subsystem 430 stores and hosts, among other things, operating system (OS) 436 to provide a software platform for execution of instructions in system 400. Additionally, other instructions 438 are stored and executed from memory subsystem 430 to provide the logic and the processing of system 400. OS 436 and instructions 438 are executed by processor 420. Memory subsystem 430 includes memory device 432 where it stores data, instructions, programs, or other items. In one embodiment, memory subsystem includes memory controller 434, which is a memory controller to generate and issue commands to memory device 432. It will be understood that memory controller 434 could be a physical part of processor 420.

Processor 420 and memory subsystem 430 are coupled to bus/bus system 410. Bus 410 is an abstraction that represents any one or more separate physical buses, communication lines/interfaces, and/or point-to-point connections, connected by appropriate bridges, adapters, and/or controllers. Therefore, bus 410 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 410 can also correspond to interfaces in network interface 450.

System 400 also includes one or more input/output (I/O) interface(s) 440, network interface 450, one or more internal mass storage device(s) 460, and peripheral interface 470 coupled to bus 410. I/O interface 440 can include one or more interface components through which a user interacts with system 400 (e.g., video, audio, and/or alphanumeric interfacing). Network interface 450 provides system 400 the ability to communicate with remote devices (e.g., servers, other computing devices) over one or more networks. Network interface 450 can include an Ethernet adapter, wireless interconnection components, USB (universal serial bus), or other wired or wireless standards-based or proprietary interfaces.

Storage 460 can be or include any conventional medium for storing large amounts of data in a nonvolatile manner, such as one or more magnetic, solid state, or optical based disks, or a combination. Storage 460 holds code or instructions and data 462 in a persistent state (i.e., the value is retained despite interruption of power to system 400). Storage 460 can be generically considered to be a "memory," although memory 430 is the executing or operating memory to provide instructions to processor 420. Whereas storage 460 is nonvolatile, memory 430 can include volatile memory (i.e., the value or state of the data is indeterminate if power is interrupted to system 400).

Peripheral interface 470 can include any hardware interface not specifically mentioned above. Peripherals refer generally to devices that connect dependently to system 400. A dependent connection is one where system 400 provides the software and/or hardware platform on which operation executes, and with which a user interacts.

In one embodiment, memory subsystem 430 includes ECC 480. ECC 480 is shown as a separate element, but represents ECC modes in memory controller 434 and can also represent an error test in memory device 432. ECC 480 includes different ECC logic paths depending on a detected error type. In one embodiment, memory controller 434 and/or memory device 432 perform a test to determine whether a detected error is a transient or persistent error. In one embodiment, transient errors are handled with a full correction mode, and hard errors are handled with erasure mode correction.

In one embodiment, system 400 is a server device. In one embodiment in a server device, system 400 can be one of multiple systems combined together in a server configuration. For example, the server can be implemented as a blade server combined with other blade servers in a chassis system.

Figure 5:
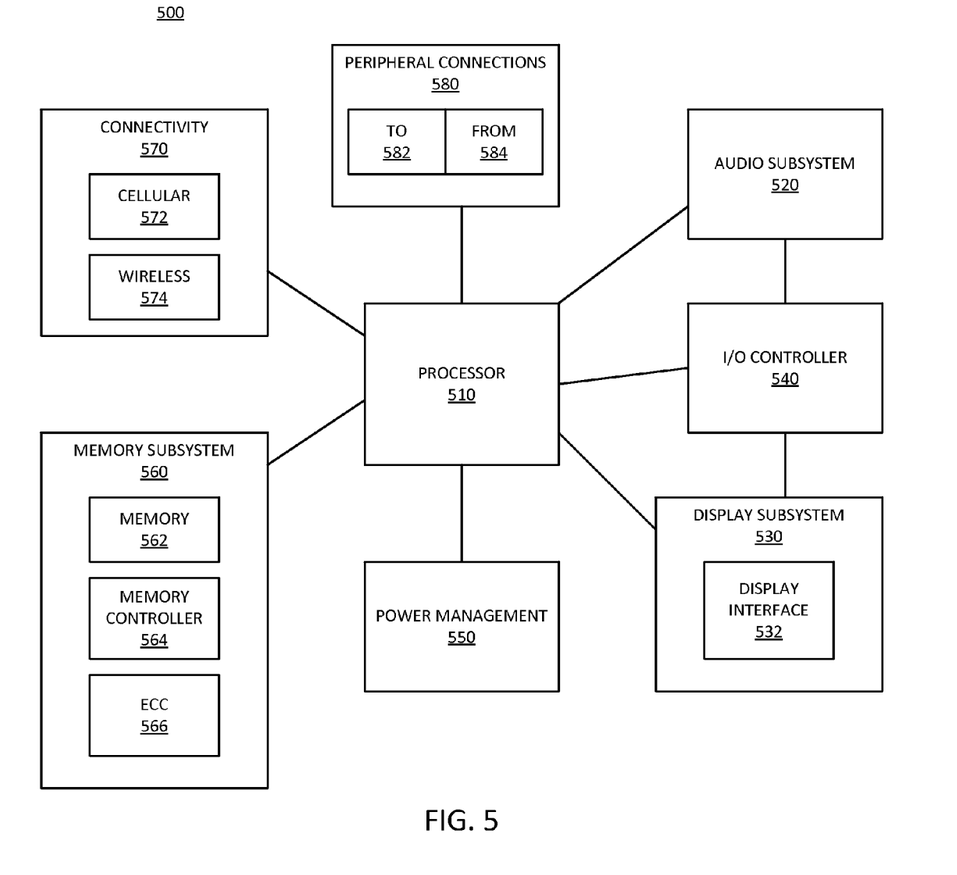
FIG. 5 is a block diagram of an embodiment of a mobile device in which dynamic ECC based on error type can be implemented.

FIG. 5 is a block diagram of an embodiment of a mobile device in which dynamic ECC based on error type can be implemented. Device 500 represents a mobile computing device, such as a computing tablet, a mobile phone or smartphone, a wireless-enabled e-reader, wearable computing device, or other mobile device. It will be understood that certain of the components are shown generally, and not all components of such a device are shown in device 500.

Device 500 includes processor 510, which performs the primary processing operations of device 500. Processor 510 can include one or more physical devices, such as microprocessors, application processors, microcontrollers, programmable logic devices, or other processing means. The processing operations performed by processor 510 include the execution of an operating platform or operating system on which applications and/or device functions are executed. The processing operations include operations related to I/O (input/output) with a human user or with other devices, operations related to power management, and/or operations related to connecting device 500 to another device. The processing operations can also include operations related to audio I/O and/or display I/O.

In one embodiment, device 500 includes audio subsystem 520, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 500, or connected to device 500. In one embodiment, a user interacts with device 500 by providing audio commands that are received and processed by processor 510.

Display subsystem 530 represents hardware (e.g., display devices) and software (e.g., drivers) components that provide a visual and/or tactile display for a user to interact with the computing device. Display subsystem 530 includes display interface 532, which includes the particular screen or hardware device used to provide a display to a user. In one embodiment, display interface 532 includes logic separate from processor 510 to perform at least some processing related to the display. In one embodiment, display subsystem 530 includes a touchscreen device that provides both output and input to a user. In one embodiment, display subsystem 530 includes a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others.

I/O controller 540 represents hardware devices and software components related to interaction with a user. I/O controller 540 can operate to manage hardware that is part of audio subsystem 520 and/or display subsystem 530. Additionally, I/O controller 540 illustrates a connection point for additional devices that connect to device 500 through which a user might interact with the system. For example, devices that can be attached to device 500 might include microphone devices, speaker or stereo systems, video systems or other display device, keyboard or keypad devices, or other I/O devices for use with specific applications such as card readers or other devices.

As mentioned above, I/O controller 540 can interact with audio subsystem 520 and/or display subsystem 530. For example, input through a microphone or other audio device can provide input or commands for one or more applications or functions of device 500. Additionally, audio output can be provided instead of or in addition to display output. In another example, if display subsystem includes a touchscreen, the display device also acts as an input device, which can be at least partially managed by I/O controller 540. There can also be additional buttons or switches on device 500 to provide I/O functions managed by I/O controller 540.

In one embodiment, I/O controller 540 manages devices such as accelerometers, cameras, light sensors or other environmental sensors, gyroscopes, global positioning system (GPS), or other hardware that can be included in device 500. The input can be part of direct user interaction, as well as providing environmental input to the system to influence its operations (such as filtering for noise, adjusting displays for brightness detection, applying a flash for a camera, or other features). In one embodiment, device 500 includes power management 550 that manages battery power usage, charging of the battery, and features related to power saving operation.

Memory subsystem 560 includes memory device(s) 562 for storing information in device 500. Memory subsystem 560 can include nonvolatile (state does not change if power to the memory device is interrupted) and/or volatile (state is indeterminate if power to the memory device is interrupted) memory devices. Memory 560 can store application data, user data, music, photos, documents, or other data, as well as system data (whether long-term or temporary) related to the execution of the applications and functions of system 500. In one embodiment, memory subsystem 560 includes memory controller 564 (which could also be considered part of the control of system 500, and could potentially be considered part of processor 510). Memory controller 564 includes a scheduler to generate and issue commands to memory device 562.

Connectivity 570 includes hardware devices (e.g., wireless and/or wired connectors and communication hardware) and software components (e.g., drivers, protocol stacks) to enable device 500 to communicate with external devices. The external device could be separate devices, such as other computing devices, wireless access points or base stations, as well as peripherals such as headsets, printers, or other devices.

Connectivity 570 can include multiple different types of connectivity. To generalize, device 500 is illustrated with cellular connectivity 572 and wireless connectivity 574. Cellular connectivity 572 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 574 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 580 include hardware interfaces and connectors, as well as software components (e.g., drivers, protocol stacks) to make peripheral connections. It will be understood that device 500 could both be a peripheral device ("to" 582) to other computing devices, as well as have peripheral devices ("from" 584) connected to it. Device 500 commonly has a "docking" connector to connect to other computing devices for purposes such as managing (e.g., downloading and/or uploading, changing, synchronizing) content on device 500. Additionally, a docking connector can allow device 500 to connect to certain peripherals that allow device 500 to control content output, for example, to audiovisual or other systems.

In addition to a proprietary docking connector or other proprietary connection hardware, device 500 can make peripheral connections 580 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, memory subsystem 560 includes ECC 566. ECC 566 is shown as a separate element, but represents ECC modes in memory controller 564 and can also represent an error test in memory device 562. ECC 566 includes different ECC logic paths depending on a detected error type. In one embodiment, memory controller 564 and/or memory device 562 perform a test to determine whether a detected error is a transient or persistent error. In one embodiment, transient errors are handled with a full correction mode, and hard errors are handled with erasure mode correction.

In one aspect, a method for error correction in a memory subsystem includes: detecting an error in read data from a memory device during an access operation to a memory address of the memory device; in response to detecting the error, executing a built in self-test (BIST) to determine if the error is a transient error at the memory address or a persistent error at the memory address; and if the error is a persistent error, performing ECC (error checking and correction) in erasure mode, including correcting an erasure for the memory address prior to applying an ECC correction algorithm; otherwise, performing full ECC correction, including applying the ECC correction algorithm without erasures, treating the error as a random bit error.

In one embodiment, the memory device comprises a volatile memory device. In one embodiment, the memory device comprises an in-package memory device. In one embodiment, the memory device comprises a x4 DIMM (dual inline memory module). In one embodiment, the memory device comprises a x8 DIMM (dual inline memory module). In one embodiment, executing the BIST further comprises performing a loopback write test to the memory address. In one embodiment, executing the BIST further comprises performing a single pattern write test. In one embodiment, executing the BIST further comprises performing a single write test of a pattern that is an inverse of data that resulted in a non-zero syndrome. In one embodiment, applying the ECC correction algorithm comprises performing a single device data correction (SDDC) routine.

In one aspect, a memory controller that performs error correction in a memory subsystem includes: error checking and correction (ECC) logic to detect an error in data received from a memory device in response to a request to read a memory address of the memory device; and I/O (input/output) hardware coupled to the memory device to send a signal to cause the memory device to perform a built in self-test (BIST) of the memory address to determine if the error is a transient error or a persistent error; wherein the ECC logic is to perform ECC in erasure mode if the error is a persistent error, including correcting an erasure for the memory address prior to applying an ECC correction algorithm; otherwise, the ECC logic is to perform full ECC correction, including applying the ECC correction algorithm without erasures, treating the error as a random bit error.

In one embodiment, the memory device is an in-package memory device packaged with the memory controller and a host processor in a system on a chip. In one embodiment, the memory device comprises a x8 DIMM (dual inline memory module). In one embodiment, the I/O hardware is to send a command to the memory device to cause the memory device to perform a loopback write test to the memory address. In one embodiment, the loopback write test comprises a single pattern write test. In one embodiment, the loopback write test comprises a single write test of a pattern that is an inverse of data that resulted in a non-zero syndrome. In one embodiment, the ECC logic is to perform single device data correction (SDDC) level correction.

In one aspect, an electronic device with a memory subsystem includes: multiple DRAMs (dynamic random access memory devices) each including a memory array of separately addressable memory locations; a memory controller including error checking and correction (ECC) logic to detect an error in data received from a memory device in response to a request to read a memory address of the memory device; and I/O (input/output) hardware coupled to the memory device to send a signal to cause the memory device to perform a built in self-test (BIST) of the memory address to determine if the error is a transient error or a persistent error; wherein the ECC logic is to perform ECC in erasure mode if the error is a persistent error, including correcting an erasure for the memory address prior to applying an ECC correction algorithm; otherwise, the ECC logic is to perform full ECC correction, including applying the ECC correction algorithm without erasures, treating the error as a random bit error; and a chassis system to couple the memory subsystem to a blade server.

In one embodiment, the memory device comprises a x8 DIMM (dual inline memory module). In one embodiment, the memory device is an in-package memory device packaged with the memory controller and a host processor in a system on a chip. In one embodiment, the memory device comprises a x8 DIMM (dual inline memory module). In one embodiment, the memory controller I/O hardware is to send a command to the memory device to cause the memory device to perform a loopback write test to the memory address. In one embodiment, the loopback write test comprises a single pattern write test. In one embodiment, the loopback write test comprises a single write test of a pattern that is an inverse of data that resulted in a non-zero syndrome. In one embodiment, the ECC logic is to perform single device data correction (SDDC) level correction.

In one aspect, an apparatus for error correction in a memory subsystem includes: means for detecting an error in read data from a memory device during an access operation to a memory address of the memory device; means for executing a built in self-test (BIST) in response to detecting the error, to determine if the error is a transient error at the memory address or a persistent error at the memory address; and means for performing ECC (error checking and correction) in erasure mode if the error is a persistent error, including means for correcting an erasure for the memory address prior to applying an ECC correction algorithm; and, means for performing full ECC correction if the error is not a persistent error, including means for applying the ECC correction algorithm without erasures, treating the error as a random bit error.

In one embodiment, the memory device comprises a volatile memory device. In one embodiment, the memory device comprises an in-package memory device. In one embodiment, the memory device comprises a x8 DIMM (dual inline memory module). In one embodiment, the means for executing the BIST further comprises means for performing a loopback write test to the memory address. In one embodiment, the means for executing the BIST further comprises means for performing a single pattern write test. In one embodiment, the means for executing the BIST further comprises means for performing a single write test of a pattern that is an inverse of data that resulted in a non-zero syndrome. In one embodiment, the means for applying the ECC correction algorithm comprises means for performing a single device data correction (SDDC) routine.

In one aspect, an article of manufacture comprising a computer readable storage medium having content stored thereon, which when accessed causes a machine to perform operations including: detecting an error in read data from a memory device during an access operation to a memory address of the memory device; in response to detecting the error, executing a built in self-test (BIST) to determine if the error is a transient error at the memory address or a persistent error at the memory address; and if the error is a persistent error, performing ECC (error checking and correction) in erasure mode, including correcting an erasure for the memory address prior to applying an ECC correction algorithm; otherwise, performing full ECC correction, including applying the ECC correction algorithm without erasures, treating the error as a random bit error.

In one embodiment, the memory device comprises a volatile memory device. In one embodiment, the memory device comprises an in-package memory device. In one embodiment, the memory device comprises a x8 DIMM (dual inline memory module). In one embodiment, the content for executing the BIST further comprises content for performing a loopback write test to the memory address. In one embodiment, the content for executing the BIST further comprises content for performing a single pattern write test. In one embodiment, the content for executing the BIST further comprises content for performing a single write test of a pattern that is an inverse of data that resulted in a non-zero syndrome. In one embodiment, the content for applying the ECC correction algorithm comprises content for performing a single device data correction (SDDC) routine.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A method for error correction in a memory subsystem, comprising:
   detecting, with ECC (error checking and correction) logic, an error in read data from a memory device during an access operation to a memory address of the memory device;
   in response to detecting the error, executing a built in self-test (BIST) to determine if the error is a transient error at the memory address or a persistent error at the memory address; and
   if the error is a persistent error, performing ECC in erasure mode, including correcting an erasure for the memory address prior to applying an ECC correction algorithm; otherwise,
   performing full ECC correction, including applying the ECC correction algorithm without erasures, treating the error as a random bit error.

2. The method of claim 1, wherein the memory device comprises a volatile memory device.

3. The method of claim 1, wherein the memory device comprises an in-package memory device.

4. The method of claim 1, wherein the memory device comprises a x4 DIMM (dual inline memory module).

5. The method of claim 1, wherein the memory device comprises a x8 DIMM (dual inline memory module).

6. The method of claim 1, wherein executing the BIST further comprises performing a loopback write test to the memory address.

7. The method of claim 6, wherein executing the BIST further comprises performing a single pattern write test.

8. The method of claim 6, wherein executing the BIST further comprises performing a single write test of a pattern that is an inverse of data that resulted in a non-zero syndrome.

9. The method of claim 1, wherein applying the ECC correction algorithm comprises performing a single device data correction (SDDC) routine.

10. A memory controller that performs error correction in a memory subsystem, comprising:
    error checking and correction (ECC) logic to detect an error in data received from a memory device in response to a request to read a memory address of the memory device; and
    I/O (input/output) hardware coupled to the memory device to send a signal to cause the memory device to perform a built in self-test (BIST) of the memory address to determine if the error is a transient error or a persistent error;
    wherein the ECC logic is to perform ECC in erasure mode if the error is a persistent error, including to correct an erasure for the memory address prior to application of an ECC correction algorithm; otherwise, the ECC logic is to perform full ECC correction, including application of the ECC correction algorithm without erasures, to treat the error as a random bit error.

11. The memory controller of claim 10, wherein the memory device is an in-package memory device packaged with the memory controller and a host processor in a system on a chip.

12. The memory controller of claim 10, wherein the memory device comprises a x8 DIMM (dual inline memory module).

13. The memory controller of claim 10, wherein the I/O hardware is to send a command to the memory device to cause the memory device to perform a loopback write test to the memory address.

14. The memory controller of claim 13, wherein the loopback write test comprises a single pattern write test.

15. The memory controller of claim 13, wherein the loopback write test comprises a single write test of a pattern that is an inverse of data that resulted in a non-zero syndrome.

16. The memory controller of claim 10, wherein the ECC logic is to perform single device data correction (SDDC) level correction.

17. An electronic device with a memory subsystem, comprising:
    multiple DRAMs (dynamic random access memory devices) each including a memory array of separately addressable memory locations;
    a memory controller including
       error checking and correction (ECC) logic to detect an error in data received from a memory device in response to a request to read a memory address of the memory device; and
       I/O (input/output) hardware coupled to the memory device to send a signal to cause the memory device to perform a built in self-test (BIST) of the memory address to determine if the error is a transient error or a persistent error;
       wherein the ECC logic is to perform ECC in erasure mode if the error is a persistent error, including to correct an erasure for the memory address prior to application of an ECC correction algorithm; otherwise, the ECC logic is to perform full ECC correction, including application of the ECC correction algorithm without erasures, to treat the error as a random bit error; and a chassis system to couple the memory subsystem to a blade server.

18. The electronic device of claim 17, wherein the memory device comprises a x8 DIMM (dual inline memory module).

19. The electronic device of claim 17, wherein the memory controller I/O hardware is to send a command to the memory device to cause the memory device to perform a loopback write test to the memory address.

20. The electronic device of claim 17, wherein the ECC logic is to perform single device data correction (SDDC) level correction.

\* \* \* \* \*